March 21, 1967 F. J. REZNICK ET AL 3,309,760
ATTACHING LEADS TO SEMICONDUCTORS
Filed Nov. 3, 1964
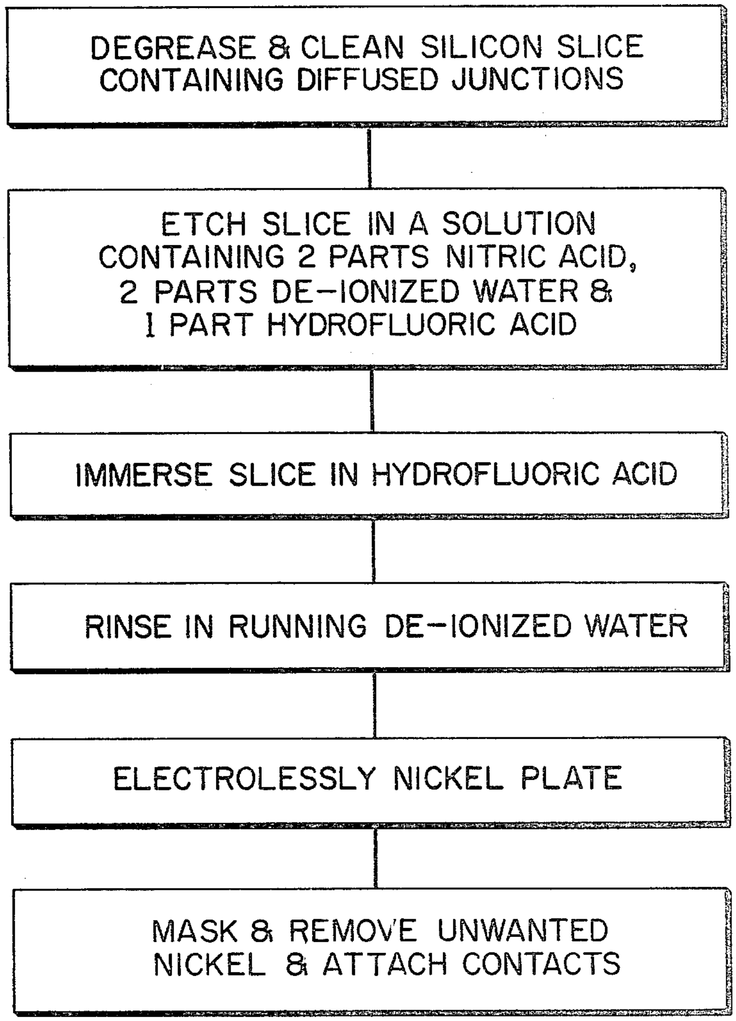
INVENTOR.
JOHN GRANVILLE NUSSEAR
FRANK JOSEPH REZNICK
BY
ATTORNEY United States Patent Office 3,309,760 Patented Mar. 21, 1967

3,309,760
ATTACHING LEADS TO SEMICONDUCTORS
Frank J. Reznick, Neptune, and John G. Nussear, Edison, N.J., assignors to The Bendix Corporation, Holmdel, N.J., a corporation of Delaware
Filed Nov. 3, 1964, Ser. No. 408,634
1 Claim. (Cl. 29—155.5)

The present invention relates to semiconductor devices and more particularly to providing semiconductor devices with good ohmic contacts.

It is desirable in processing semiconductors to provide a metallized surface on the wafer of semiconductor material which will provide a good ohmic contact. One method of providing such a metallized surface is by plating with a metal such as nickel. However, difficulties are encountered in plating on a polished semiconductor surface, for example, a polished silicon wafer, whether the method is electroless or elecrtolytic. Silicon is a material which is passive in nature and hence is difficult to plate. It is necessary that the surface be activated in some manner without doing any physical or metallurgical damage yet have good adherence of the plating. Some examples of surface preparation are by surface abrasion, chemical etches and sintering. In using any of the forenoted, it is difficult not to damage the surface of the wafer.

The present invention provides a method in which the surface of the wafer is prepared for plating without causing any physical or metallurgical damage to the wafer.

It is an object of the persent invention to provide an improved ohmic contact for a semiconductor device.

Another object of the invention is to provide an improved method of plating a wafer of semiconductor material.

Another object of the invention is to provide an improved method of nickel plating a slice of silicon.

A further object of the invention is to provide an improved method of forming an ohmic contact on a slice of silicon.

The above and other objects and features of the invention will appear more fully hereinafter from a consideration of the following description taken in connection with the accompanying drawing wherein one embodiment is illustrated by way of example.

The single figure is a flow chart of one form of the method of the invention.

In the method as illustrated in the drawing, a slice of silicon, which may be of a predetermined type having diffused junctions therein, is first degreased and cleaned. The degreasing can be effected by immersing the slice of silicon in standard solvents. Such solvents are aromatic hydrocarbons, ketones and alcohols. Specific examples are benzene, xylene, ethanol, methanol and actone. After removing from the solvent, the slice is rinsed well with deionized water. The slice is then ready for the surface preparation prior to plating.

Next, the following acid etchants are prepared and used as hereniafter set forth. A 2:2:1 mixture is prepared by mixing 2 parts nitric acid (48%), 2 parts de-ionized water and 1 part of hydrofluoric acid (concentrated). This mixture is placed in a suitable container. Into another container a suitable volume of concentrated hydrofluoric acid is placed. The silicon slice is first immersed in the 2:2:1 mixture and etched for a predetermined time for example, approximately 15 seconds. It is then removed and immediately immersed into the hydrofluoric acid for a few seconds, for example, approximately 5 seconds. It is necessary that each container have sufficient solutions to insure full immersion of the slice during the operational sequence. From the hydrofluoric acid the slice is quickly immersed into a container of running de-ionized water and rinsed well. The slice is now ready for plating. The slice is then placed in an electroless nickel plating bath where it is given a plating of a predetermined thickness. After plating it is ready for further processing into a finished unit by removing any unwanted nickel by etching and attaching contacts as desired.

Because of the nature of silicon, surface activation and adhesion are difficult to achieve and maintain. The aforenoted method overcomes these limitations. It provides more uniformity, less handling, less breakage and better results such as improved electrical parameters in semiconductor devices.

While silicon has been used in illustrating the invention, it is understood that the method could be extended to other semiconductor materials by those skilled in the art.

Although only one embodiment of the invention has been illustrated and described, various changes in the form and relative arrangement of the parts, which will now appear to those skilled in the art, may be made without departing from the scope of the invention.

What is claimed is:

A method of making ohmic contacts to a slice of silicon comprising: degreasing and cleaning said slice, then etching said slice in a 2:2:1 solution of 48% nitric acid, deionized water and concentrated hydrofluoric acid for approximately 15 seconds, next immersing said slice of semiconductor material in concentrated hydrofluoric acid for approximately 5 seconds, next rinsing in running deionized water, next electrolessly nickel-plating said slice, then removing unwanted portions of the nickel plate by etching, and finally attaching contacts to desired portions of the nickel plate remaining on the slice.

References Cited by the Examiner

UNITED STATES PATENTS

| | | | |
|---|---|---|---|
| 2,930,722 | 3/1960 | Ligenza | 148—33.3 X |
| 2,948,642 | 8/1960 | MacDonald | 148—1.5 |
| 3,146,514 | 9/1964 | Knau | 29—25.3 |

JOHN F. CAMPBELL, *Primary Examiner.*

WILLIAM I. BROOKS, *Examiner.*